(12) United States Patent
Acosta et al.

(10) Patent No.: US 10,914,800 B2
(45) Date of Patent: Feb. 9, 2021

(54) MAGNETIC RESONANCE SPECTROMETER

(71) Applicants: STC.UNM, Albuquerque, NM (US);
Victor Acosta, Albuquerque, NM (US);
Andrejs Jarmola, Albany, CA (US);
Lykourgos Bougas, El Cerrito, CA (US); Dmitry Budker, El Cerrito, CA (US)

(72) Inventors: Victor Acosta, Albuquerque, NM (US);
Andrejs Jarmola, Albany, CA (US);
Lykourgos Bougas, El Cerrito, CA (US); Dmitry Budker, El Cerrito, CA (US)

(73) Assignee: STC.UNM, Albuquerque, NM (US)

( * ) Notice: Subject to any disclaimer, the term of this patent is extended or adjusted under 35 U.S.C. 154(b) by 502 days.

(21) Appl. No.: 15/743,527

(22) PCT Filed: Jul. 11, 2016

(86) PCT No.: PCT/US2016/041760
§ 371 (c)(1),
(2) Date: Jan. 10, 2018

(87) PCT Pub. No.: WO2017/011393
PCT Pub. Date: Jan. 19, 2017

(65) Prior Publication Data
US 2018/0203080 A1    Jul. 19, 2018

Related U.S. Application Data

(60) Provisional application No. 62/191,014, filed on Jul. 10, 2015, provisional application No. 62/261,802, filed on Dec. 1, 2015.

(51) Int. Cl.
*G01R 33/32* (2006.01)
*G01N 24/08* (2006.01)
(Continued)

(52) U.S. Cl.
CPC ............ *G01R 33/323* (2013.01); *C30B 29/04* (2013.01); *C30B 33/08* (2013.01); *C30B 33/12* (2013.01);
(Continued)

(58) Field of Classification Search
CPC .. G01R 33/323; G01R 33/302; G01R 33/441; G01R 33/46; G01R 33/60; G01N 24/08; G01N 24/10
See application file for complete search history.

(56) References Cited

U.S. PATENT DOCUMENTS

| | | | |
|---|---|---|---|
| 5,864,143 A | * | 1/1999 | Ueda ............... H01J 37/3171 |
| | | | 250/492.21 |
| 6,051,063 A | | 4/2000 | Tanabe et al. |

(Continued)

FOREIGN PATENT DOCUMENTS

| | | |
|---|---|---|
| WO | 1994002865 A1 | 2/1994 |
| WO | 2014138172 A1 | 9/2014 |
| WO | 2015015172 A1 | 2/2015 |

OTHER PUBLICATIONS

Maze et al., "Nanoscale magnetic sensing with an individual electronic spin in diamond," Nature vol. 455, Oct. 2, 2008.
(Continued)

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

Technologies relating to a magnetic resonance spectrometer are disclosed. The magnetic resonance spectrometer may include a doped nanostructured crystal. By nanostructuring the surface of the crystal, the sensor-sample contact area of the crystal can be increased. As a result of the increased sensor-sample contact area, the output fluorescence signal (Continued)

emitted from the crystal is also increased, with corresponding reductions in measurement acquisition time and requisite sample volumes.

20 Claims, 6 Drawing Sheets

(51) Int. Cl.

| | |
|---|---|
| G01N 24/10 | (2006.01) |
| G01R 33/30 | (2006.01) |
| G01R 33/44 | (2006.01) |
| G01R 33/46 | (2006.01) |
| G01R 33/60 | (2006.01) |
| C30B 33/08 | (2006.01) |
| C30B 29/04 | (2006.01) |
| C30B 33/12 | (2006.01) |

(52) U.S. Cl.
CPC ............ *G01N 24/08* (2013.01); *G01N 24/10* (2013.01); *G01R 33/302* (2013.01); *G01R 33/441* (2013.01); *G01R 33/46* (2013.01); *G01R 33/60* (2013.01)

(56) References Cited

U.S. PATENT DOCUMENTS

| | | |
|---|---|---|
| 7,300,631 B2 | 11/2007 | Miller |
| 8,193,808 B2 | 6/2012 | Fu |
| 8,415,640 B2 * | 4/2013 | Babinec .................. G01N 21/64 250/458.1 |
| 8,547,090 B2 | 10/2013 | Lukin |
| 8,669,764 B2 | 3/2014 | Twitchen |
| 8,758,509 B2 | 6/2014 | Twitchen |
| 9,772,284 B2 | 9/2017 | Quan |
| 2009/0149726 A1 | 6/2009 | Hyde et al. |
| 2014/0037932 A1 | 2/2014 | Twitchen et al. |
| 2016/0054402 A1 | 2/2016 | Meriles |

OTHER PUBLICATIONS

Balasubramanian et al., "Nanoscale imaging magnetometry with diamond spins under ambient conditions," Nature vol. 455, Oct. 2, 2008.

International Preliminary Report on Patentability for counterpart International Application PCT/US2016/041760, dated Jan. 16, 2018.

\* cited by examiner

MAGNETIC RESONANCE SPECTROMETER

CROSS REFERENCE TO RELATED APPLICATIONS

This application is a U.S. National Stage filing under 35 U.S.C. § 371 of International Application No. PCT/US16/41760, filed on Jul. 11, 2016, which claims priority to U.S. Provisional Application No. 62/191,014, filed on Jul. 10, 2015, entitled "Nanophotonic Magnetic-Resonance Spectrometer for Chemical Trace Analysis," and to U.S. Provisional Application No. 62/261,802, filed on Dec. 1, 2015, entitled "Nanophotonic Electron Paramagnetic Resonance Sensor." The prior applications are incorporated by reference in their entirety.

BACKGROUND

Magnetic resonance spectrometer techniques, such as those described in Staudacher 2013, Mamin 2013, Sushkov 2014, Haberle 2015, Rugar 2015, and DeVience 2015, are a significant scientific breakthrough. However, further development remains necessary if the technology is to achieve wider adoption.

Currently, magnetic resonance spectrometers detect Nuclear Magnetic Resonance (NMR) in liquids across a smooth liquid-solid interface, using single color center sensors or small ensembles of centers. Using this approach, measurement times can be very long (hours to days); samples must generally be of large quantity to include sufficiently abundant nuclei for measurement; and laborious sample preparation is involved, owing to stochastic placement of color center sensors relative to targets.

Improved magnetic resonance spectrometers are desired, which overcome these and other drawbacks, and which are better suited for adoption in a wide range of useful applications.

SUMMARY

A magnetic resonance spectrometer, methods of using the magnetic resonance spectrometer, and methods of manufacturing the magnetic resonance spectrometer are disclosed. Some example magnetic resonance spectrometers may include a doped nanostructured crystal, a light source, and a photodetector. An analyte may be positioned in the doped nanostructured crystal for measurement. The light source may generate one or more light pulses directed at the doped nanostructured crystal. The photodetector may detect a fluorescence signal emitted from the doped nanostructured crystal, wherein the fluorescence signal is influenced by magnetic resonance processes in the analyte. The detected fluorescence signal may be compared, e.g., to one or more known fluorescence signals, in order to determine a chemical composition of the analyte.

Additional aspects of the magnetic resonance spectrometer may include, e.g., a dichroic mirror to direct the light pulses at the doped nanostructured crystal, a microscope objective to focus the light pulses at a desired location on the doped nanostructured crystal, one or more magnets arranged to generate a magnetic field at the doped nanostructured crystal, an electromagnetic resonator arranged to generate a pulsed electromagnetic field at the doped nanostructured crystal, and a microfluidic chip arranged to position the analyte between the plurality of doped crystal nanostructures. These and other aspects of the magnetic resonance spectrometer are described in further detail herein.

The doped nanostructured crystal may comprise a plurality of doped crystal nanostructures, each having at least one dimension of ten microns or less. The doped crystal nanostructures may comprise, e.g., a diamond doped with paramagnetic color centers such as Nitrogen-Vacancy (NV) color centers. The doped nanostructured crystal may be manufactured as disclosed herein.

Example methods to manufacture the doped nanostructured crystal may include fabricating, on a crystal surface, a plurality of crystal nanostructures each having at least one dimension of ten microns or less. The crystal surface with the plurality of crystal nanostructures may comprise, e.g., a tenfold or larger surface area enhancement in comparison to the crystal surface without the plurality of crystal nanostructures. Doping the plurality of crystal nanostructures with NV color centers may include implanting ions in a surface layer of the plurality of crystal nanostructures, and annealing the plurality of crystal nanostructures. These and other aspects of manufacturing the doped nanostructured crystal, and subsequently assembling the magnetic resonance spectrometer, are described in further detail herein.

Some example methods of using magnetic resonance spectrometers may include, e.g., methods to identify a chemical composition of an analyte from Nuclear Magnetic Resonance (NMR) or Nuclear Quadrupole Resonance (NQR) of the analyte. The analyte may be positioned between the doped crystal nanostructures of the doped nanostructured crystal. Light pulses and electromagnetic pulses may be directed at the doped nanostructured crystal in order to interrogate the paramagnetic color centers. A NMR or NQR influenced fluorescence signal emitted from the doped nanostructured crystal may be detected, wherein the detected NMR or NQR influenced fluorescence signal is influenced by the chemical composition of the analyte. The detected NMR or NQR influenced fluorescence signal may be compared to at least one known NMR or NQR influenced fluorescence signal, in order to identify the chemical composition of the analyte.

Further example methods of using magnetic resonance spectrometers may include, e.g., methods to identify a chemical composition of an analyte from Electron Paramagnetic Resonance (EPR) of the analyte. The analyte may be positioned between the doped crystal nanostructures of the doped nanostructured crystal. Light pulses and electromagnetic pulses may be directed at the doped nanostructured crystal in order to interrogate the paramagnetic color centers. An EPR influenced fluorescence signal emitted from the doped nanostructured crystal may be detected, wherein the detected EPR influenced fluorescence signal is influenced by the chemical composition of the analyte. The detected EPR influenced fluorescence signal may be compared to at least one known EPR influenced fluorescence signal, in order to identify the chemical composition of the analyte. In some embodiments, analytes may be tested for the presence of the malarial byproduct hemozoin, e.g., by comparing the EPR influenced fluorescence signal to EPR influenced fluorescence signal produced by the malarial byproduct hemozoin. Such methods may be beneficial for malaria screening. Further aspects and embodiments are described in detail below.

BRIEF DESCRIPTION OF THE DRAWINGS

Various features and attendant advantages of the disclosed technologies will become fully appreciated when considered in conjunction with the accompanying drawings, in which like reference characters designate the same or similar parts throughout the several views, and wherein.

DETAILED DESCRIPTION

Prior to explaining embodiments of the invention in detail, it is to be understood that this disclosure is not limited to the details of construction or arrangements of the components and method steps set forth in the following description or illustrated in the drawings. Embodiments of this disclosure are capable of other embodiments and of being practiced and carried out in various ways. Also, it is to be understood that the phraseology and terminology employed herein are for the purpose of the description and should not be regarded as limiting.

This disclosure describes technologies relating to a magnetic resonance spectrometer. The disclosed magnetic resonance spectrometer may generally include a doped nanostructured crystal. By nanostructuring the surface of the crystal, the sensor-sample contact area of the crystal can be greatly increased. As a result of the increased sensor-sample contact area, the output fluorescence signal emitted from the crystal is also increased, with corresponding reductions in measurement acquisition time and requisite sample volumes, and a variety of other benefits.

Figure 1:
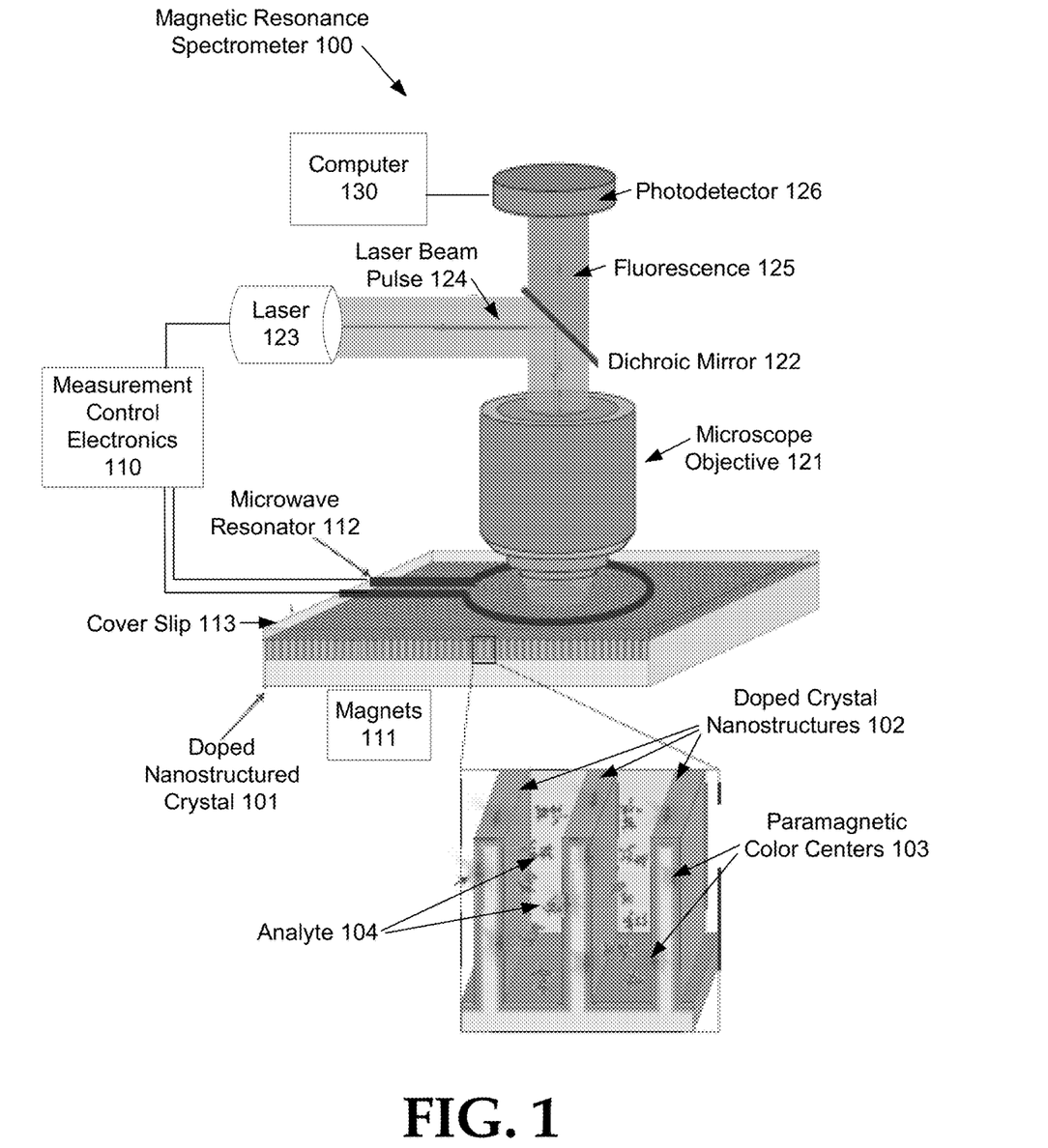
FIG. 1 illustrates an example magnetic resonance spectrometer.

FIG. 1 illustrates an example magnetic resonance spectrometer 100, in accordance with some embodiments of this disclosure. Magnetic resonance spectrometer 100 includes a doped nanostructured crystal 101, the doped nanostructured crystal 101 comprising a plurality of doped crystal nanostructures 102, each having at least one dimension of ten microns or less. The plurality of doped crystal nanostructures 102 are doped with paramagnetic color centers 103. An analyte 104 for measurement by the magnetic resonance spectrometer 100 may be positioned between the plurality of doped crystal nanostructures 102. A microfluidic chip (not shown in FIG. 1) may be arranged to position the analyte 104 between the plurality of doped crystal nanostructures 102. A transparent cover slip 113 is positioned over the doped nanostructured crystal 101.

Magnetic resonance spectrometer 100 further includes a light source in the form of a laser 123 which generates one or more light pulses, such as laser beam pulses 124. The laser beam pulses 124 are directed at the doped nanostructured crystal 101 via a dichroic mirror 122 and microscope objective 121. A photodetector 126 is arranged to detect a fluorescence signal 125 emitted from the doped nanostructured crystal 101, wherein the fluorescence signal 125 is influenced by the analyte 104.

Magnetic resonance spectrometer 100 further includes one or more magnets 111 arranged to generate a magnetic field at the doped nanostructured crystal 101, and an electromagnetic resonator such as microwave resonator 112 arranged to generate a pulsed electromagnetic field at the doped nanostructured crystal 101. The pulsed electromagnetic field may comprise, e.g., a pulsed microwave frequency electromagnetic field. Measurement control electronics 110 may optionally be used to control laser 123 and microwave resonator 112, in order to produce desired conditions at the doped nanostructured crystal 101. In some embodiments, measurement control electronics 110 may furthermore control magnets 111, e.g., a position, orientation, or strength of magnets 111. A computer 130 may be coupled to photodetector 126. Computer 130 may be arranged to compare the fluorescence signal 125 to one or more known fluorescence signals, e.g., fluorescence signals stored in a fluorescence signal library at computer 130.

In general, magnetic resonance spectrometer 100 may operate by positioning the analyte 104 between the plurality of doped crystal nanostructures 102, and using the magnetic fields from magnets 111, as well as laser beam pulses 124 and/or pulsed microwave frequency electromagnetic fields generated by microwave resonator 112 to activate desired conditions in the doped nanostructured crystal 101 and analyte 104. Laser beam pulses 124 may be directed at the dichroic mirror 122, and dichroic mirror 122 may direct the laser beam pulses 124 at the doped nanostructured crystal 101. Laser beam pulses 124 may pass through the microscope objective 121 to the doped nanostructured crystal 101.

The doped nanostructured crystal 101 contains large numbers of paramagnetic color sensors 103, e.g., the doped nanostructured crystal 101 may contain one billion or more paramagnetic color sensors 103. Each paramagnetic color sensor 103 serves as a tiny magnetic field sensor by optically detecting changes in energy levels. By applying laser beam pulses 124 and microwaves from microwave resonator 112, the magnetic field from the analyte's 104 precessing nuclear magnetization becomes encoded in the fluorescence signal 125 produced by the paramagnetic color sensors 103.

Fluorescence signal 125 may return through the microscope objective 121 the dichroic mirror 122 to the photodetector 126. Photodetector 126 may detect fluorescence signal 125 emitted from doped nanostructured crystal 101. Because fluorescence signal 125 is influenced by the analyte 104, fluorescence signal 125 may be used to ascertain chemical composition of the analyte 104. For example, analysis of a detected time dependent fluorescence signal 125 may reveal, e.g., the NMR, NQR, or EPR spectrum of the analyte 104, from which the chemical composition of the analyte 104 may be established, by comparison of fluorescence signal 125 with known fluorescence signals.

In some embodiments, laser beam pulses 124 may be directed at a waveguide mode along a side of the doped nanostructured crystal 101, and the photodetector 126 may be positioned detect fluorescence signal 125 emitted through the waveguide mode, thereby potentially eliminating the need for microscope objective 121 and/or dichroic mirror 122.

The detection sensitivity of the magnetic resonance spectrometer 100 depends on the area density of paramagnetic color centers 103 which can sense nuclei in the analyte 104. To increase the area density of paramagnetic color centers 103, the surface of the doped nanostructured crystal 101 can be nanostructured as described herein. This also enhances contact between the doped nanostructured crystal 101 and the analyte 104.

In some embodiments, doped nanostructured crystal 101 may comprise doped nanostructured diamond, and the plurality of doped crystal nanostructures 102 may correspondingly comprise a plurality of doped diamond nanostructures. The paramagnetic color centers 103 may comprise nitrogen-vacancy (NV) color centers. In other embodiments, the doped nanostructured crystal 101 may comprise doped nanostructured Silicon Carbide, and paramagnetic color centers 103 may comprise Si-vacancy and divacancy defects. In further embodiments, the doped nanostructured crystal 101 may comprise doped nanostructured laser crystals (e.g. vanadates, garnets, sapphire, fluorides, etc.), and paramagnetic color centers 103 may comprise rare earth ions.

In some embodiments, a size of the doped nanostructured crystal 101 may be about one square centimeter or less. In other words, length and width dimensions of the doped nanostructured crystal 101 may each be about one centimeter or less. In some embodiments, a size of the doped nanostructured crystal 101 may be about one square millimeter or less. While small size is preferable for many applications, the size of the doped nanostructured crystal 101 may also be larger if desired in connection with particular applications. The doped nanostructured crystal 101 need not necessarily be square as illustrated in FIG. 1. For example, rectangular or elliptical shapes may be preferred for some embodiments.

In some embodiments, the plurality of doped crystal nanostructures 102 may comprise a plurality of doped crystal microgratings, each having at least one dimension of ten microns or less. The term "microgratings" is used herein to refer to wall like structures which are separated from one other on opposite sides by wall separation distances, as illustrated in FIG. 1. For example, the doped crystal nanostructures 102 in FIG. 1 are in the form of generally parallel walls, each separated by a wall separation distance. Dimensions of the illustrated doped crystal nanostructures 102 may comprise, e.g., a height of about 1 micron (μm), a width of about 200 nanometers (nm), and a wall separation distance of about 400 nm. These example dimensions are illustrative only, and this disclosure is not limited to any specific dimensions of doped crystal nanostructures 102. In some embodiments, the plurality of doped crystal nanostructures 102 may each have at least one dimension of one micron or less. For example, the microgratings illustrated in FIG. 1 may comprise nanogratings having at least one dimension of one micron or less.

Figure 2:
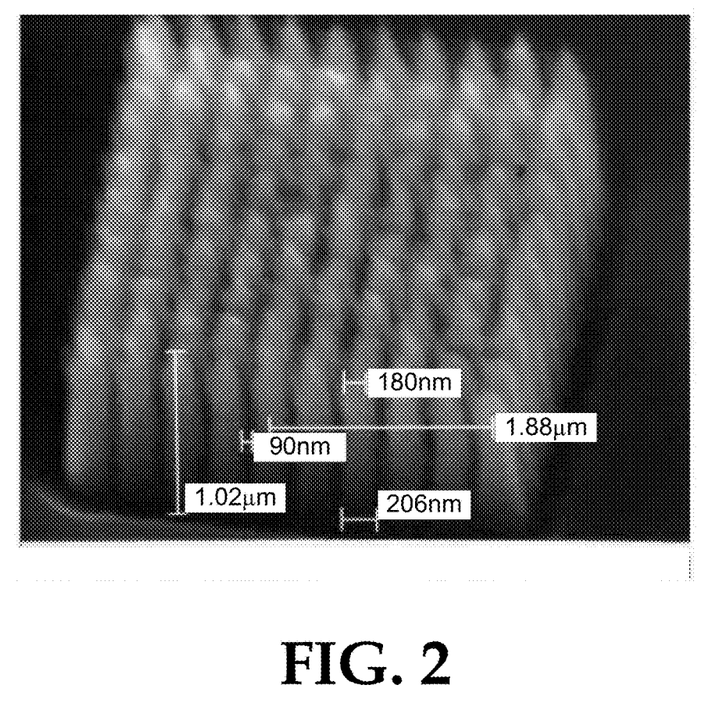
FIG. 2 is a scanning electron micrograph of example doped crystal micropillars.

FIG. 2 is a scanning electron micrograph of an example doped nanostructured crystal 101 including doped crystal nanostructures 102. The doped crystal nanostructures 102 are in the form of doped crystal micropillars, each having at least one dimension of ten microns or less. The term "micropillars" is used herein to refer to pillar or column like structures which are separated from one other on all sides by pillar separation distances. The micropillars illustrated in FIG. 2 have a top width of about 180 namometers (nm), a bottom width of about 206 nm, and a height of about 1.02 μm. A pillar separation distance of about 90 nm separates the micropillars from one another. Again, these example dimensions are illustrative only, and this disclosure is not limited to any specific dimensions of doped crystal nanostructures 102. In some embodiments, the micropillars illustrated in FIG. 2 may comprise nanopillars having at least one dimension of one micron or less.

In general, the doped nanostructured crystal 101 may include doped crystal nanostructures 102 of a size and spacing which yields a significant increase in surface area in comparison to a crystal without nanostructures. For example, the doped nanostructured crystal 101 may comprise a tenfold or larger surface area enhancement in comparison to a crystal without nanostructures.

Figure 3:
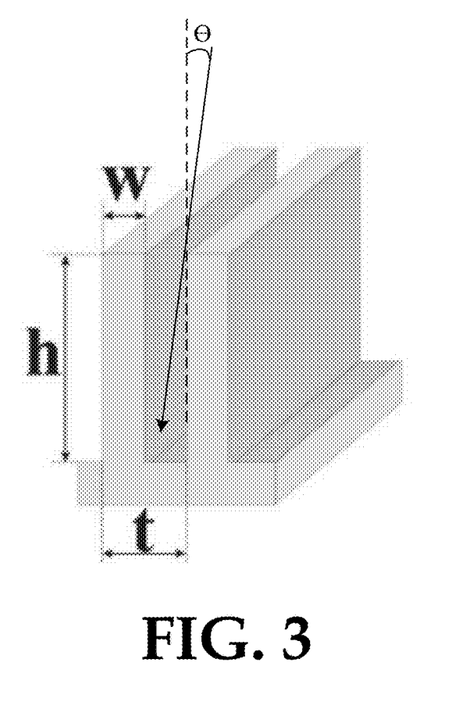
FIG. 3 illustrates an example doped crystal micrograting and dimensions thereof.

Surface area enhancement is a function of the density of the doped crystal nanostructures 102 as well as the aspect ratio of the doped crystal nanostructures 102. In order to achieve large surface area enhancements, doped crystal nanostructures 102 may generally be of high density and high aspect ratio. FIG. 3 illustrates an example nanograting with nanostructures having a width w, a height h, and a spacing t. The effective surface area of the example nanograting is a factor $\eta=2$ h/t+1 greater than that of an untextured surface (e.g., a crystal without nanostructures). This can be recast in the form $\eta=2\alpha d$, where $\alpha=h/w$ is the line aspect ratio and $d=w/t$ is the fractional packing density. In many fabrication processes the aspect ratio and packing fraction are competing variables, for example due to shadowing effects from neighboring structures. For the purpose of this disclosure, fractional packing densities of 0.5 and higher are considered high density, and line aspect ratios of 2 and higher are considered high aspect ratio.

In some embodiments, dimensions of the doped crystal nanostructures 102 may be chosen such that each nanostructure acts as an optical antenna for excitation of the paramagnetic color centers 103, or as an optical antenna for excitation of the fluorescence signal 125. For example, a height of a nanopillar may be an integer multiple of half wavelengths of laser beam pulses 124 (e.g., an integer multiple of half wavelengths of 500-650 nm laser beam pulses), or an integer multiple of half wavelengths of fluorescence signal 125 (e.g., an integer multiple of half wavelengths of 650-800 nm fluorescence signals). When the nanostructures act as optical antennae, the excitation intensity to efficiently interrogate the paramagnetic color centers 103 may be significantly reduced. Furthermore owing to the directional emission, significant increases in fluorescence collection efficiency can be realized. These factors may be leveraged to reduce the overall power consumption of the magnetic resonance spectrometer 100 and increase its sensitivity.

In some embodiments, the doped crystal nanostructures 102 may include nanoscale pores and other structures thereon, which restrict the motional degrees of freedom of molecules in solution (e.g. molecules of analyte 104). A thin adsorbed layer from liquid analyte 104 may form on the doped crystal nanostructures 102, thereby enabling liquid-state NQR spectroscopy using magnetic resonance spectrometer 100. Liquid-state NQR techniques may find application in the identification of trace quantities (sub-nanoliter) of liquid explosives or even proteins, peptides, and other biologically-relevant macromolecules in solution.

In some embodiments, the doped nanostructured crystal 101 may comprise a large number of paramagnetic color centers 103. For example, the doped nanostructured crystal 101 may comprise one billion or more total paramagnetic color centers 103. The paramagnetic color centers 103 may be implanted in a surface layer of the doped crystal nanostructures 102, e.g., a layer which extends from the surface of the doped crystal nanostructures 102 to about 2 µm below the surface of the doped crystal nanostructures 102.

Transfer of the electron spin polarization from the paramagnetic color centers 103 to the analyte 104 is realized via hyperfine coupling with nearby nuclear spins. In some cases the paramagnetic color centers 103 may be near enough to the surface of the doped crystal nanostructures 102 that the paramagnetic color centers 103 can directly transfer polarization to the nuclei in the analyte 104 via the hyperfine interaction. For this process to be efficient, the hyperfine coupling rate exceeds the longitudinal relaxation rate or physical diffusion rate of nuclei in the analyte 104. This typically occurs when the paramagnetic color centers 103 are within a few nanometers of the surface of the doped crystal nanostructures 102. In some embodiments, efficient polarization of the entire analyte 104 sample can be realized by continuously performing optical pumping with laser beam pulses 124, and allowing the induced nuclear spin polarization to diffuse over the entire analyte 104 sample. In cases where the paramagnetic color centers 103 are not near enough to the surface to satisfy the above condition, the doped crystal nanostructures 102 may contain nuclear spins which are coupled sufficiently strongly to the paramagnetic color center 103 electron spins. In this case, polarization transfer may occur via nuclear spin diffusion across the crystal-analyte interface.

In some embodiments, microwave resonator 112 may be replaced or otherwise adapted to generate Radio Frequency (RF) pulses instead of, or in addition to, microwave pulses. Methods disclosed herein may similarly be adapted to use RF pulses instead of or in addition to microwave pulses.

Figure 4:
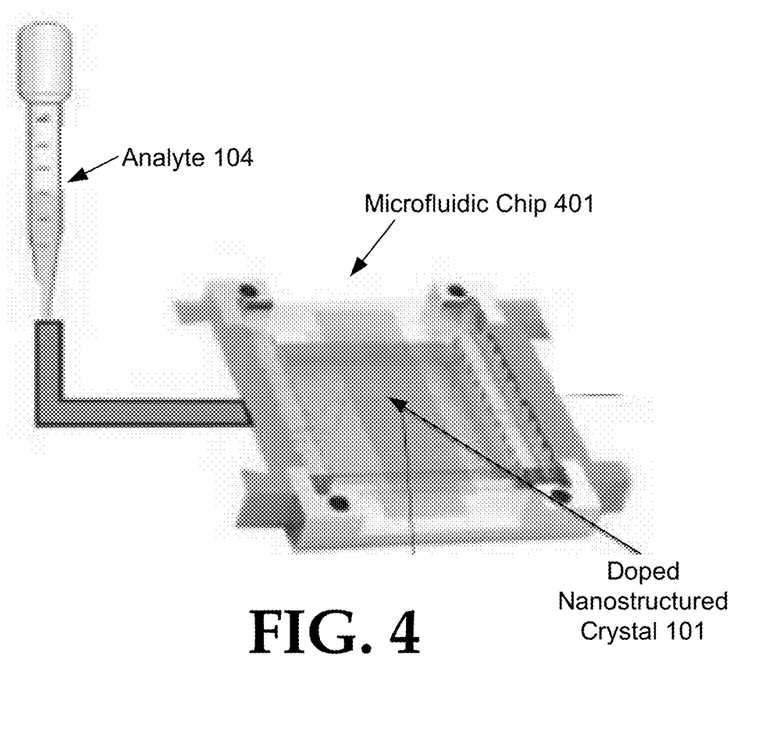
FIG. 4 illustrates an example microfluidic chip.

FIG. 4 illustrates an example microfluidic chip 401 in accordance with some embodiments of this disclosure. Microfluidic chip 401 may be coupled to a tube or other intake through which analyte 104 is delivered to the microfluidic chip 401. Microfluidic chip 401 may comprise a housing inside which doped nanostructured crystal 101 is positioned. Microfluidic chip 401 may deliver the analyte 104 onto or into the doped nanostructured crystal 101. In some embodiments, microfluidic flow may transport the analyte 104 across the doped nanostructured crystal 101, while doped crystal nanostructures 102 may enhance analyte 104 contact with the doped crystal nanostructures 102 and efficiently guide the light emitted from the paramagnetic color centers 103, resulting in greater NMR/NQR sensitivity. In some embodiments, a microfluidic chip 401 may be incorporated into magnetic resonance spectrometer 100, e.g., by replacing the doped nanostructured crystal 101 illustrated in FIG. 1 with the microfluidic chip 401 including the doped nanostructured crystal 101 illustrated in FIG. 4.

In some embodiments, the laser beam pulses 124 may comprise green laser beam pulses. For example, laser beam pulses 124 may have a wavelength between 500 nanometers (nm) and 650 nm. In some embodiments, light pulses other than laser beam pulses may be employed. For example, Light Emitting Diodes (LEDs) or other lights that emit desired light frequencies may be incorporated in some embodiments. In some embodiments, a light source that emits many frequencies may be filtered to narrow the frequency band. The photodetector 126 may be arranged to detect fluorescence signals 125 having a wavelength between 650 nm and 800 nm. Magnets 111 may be arranged to generate a magnetic field of 1-100 milliteslas (mT) or less at the doped nanostructured crystal 101.

Figure 5:
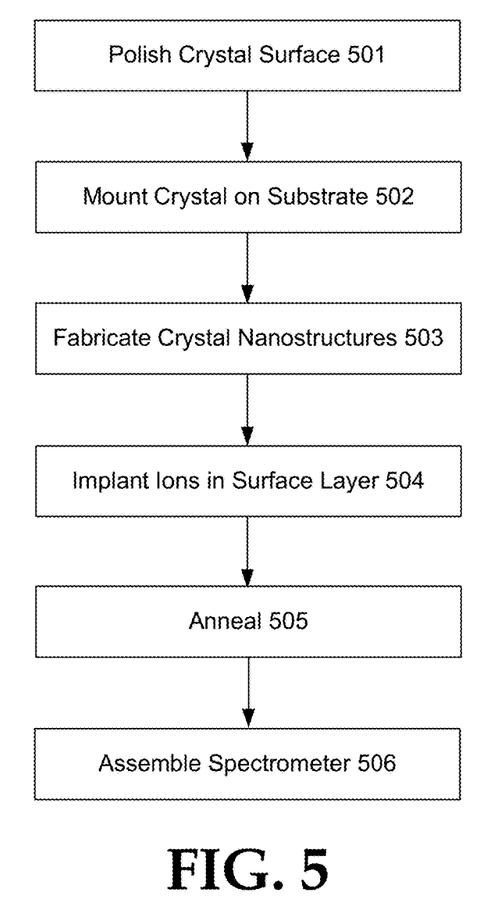
FIG. 5 illustrates an example method to manufacture a doped nanostructured crystal and magnetic resonance spectrometer.

FIG. 5 illustrates an example method to manufacture a doped nanostructured crystal, such as doped nanostructured crystal 101, and subsequent assembly of the magnetic resonance spectrometer 100. The example method includes, "Polish Crystal Surface" 501, "Mount Crystal on Substrate" 502, "Fabricate Crystal Nanostructures" 503, "Implant Ions in Surface Layer" 504, "Anneal" 505, and "Assemble Spectrometer" 506. While the illustrated operations are arranged in one example sequence, the operations may be performed in different sequences in some embodiments.

At the "Polish Crystal Surface" operation 501, a crystal surface, e.g., a diamond surface, may be polished to a thickness of 5-30 microns. Any of a variety of polishing techniques may be used. Operation 501 may be followed by operation 502.

At the "Mount Crystal on Substrate" operation 502, the polished crystal surface may be mounted on a substrate, e.g., a quartz substrate. Operation 502 may be followed by operation 503.

At the "Fabricate Crystal Nanostructures" operation 503, a plurality of crystal nanostructures may be fabricated on the polished crystal surface. In general, the crystal nanostructures may each have at least one dimension of ten microns or less, as described herein. The density and aspect ratios of the crystal nanostructures may configured such that the crystal surface with the plurality of crystal nanostructures comprises a tenfold or larger surface area enhancement in comparison to the crystal surface without the plurality of crystal nanostructures.

In some embodiments, crystal nanostructures may be fabricated using a lithography process. For example, interferometric lithography or electron beam lithography may be used to make a mask, and the exposed crystal which is not covered by the mask may then be removed through ion etching.

In some embodiments, crystal nanostructures may be fabricated using focused ion beam milling. For example, a computer controlled ion beam milling apparatus may be used to mill the polished crystal surface according to a desired milling depth and pattern which leaves behind the desired crystal nanostructures. Operation 503 may be followed by operation 504. In some embodiments, operation 504 may be performed prior to operation 503.

At the "Implant Ions in Surface Layer" operation 504, ions may be implanted in the surface layer of the plurality of crystal nanostructures. In some embodiments, an ion beam, including ions of the desired ion type, may be directed at the crystal nanostructures in order to implant the ions therein. Example ion types include $^{15}N^+$ ions or $He^+$ ions.

For example, in some embodiments, an ultrapure electronic grade diamond ([N]<5 parts per billion (ppb)) may be implanted with $^{15}N^+$ ions at several different energies in order to produce a substantially uniform layer of $^{15}N^+$ ions over a 1.5 micron thick layer. The dose of $^{15}N^+$ ions and also the annealing temperatures at operation 505 may be varied in order to enhance vacancy mobility and reduce parasitic paramagnetic species.

In another example, a High Pressure, High Temperature (HPHT) type IIa diamond ([N]~1 parts per million (ppm)) may be implanted with $He^+$ ions at several different energies to produce a substantially uniform vacancy concentration of ~1 ppm over a 2 micron thick layer. HPHT type diamonds typically exhibit low fluorescence, such that devices can be fabricated on the surface without worrying about background luminescence. The dose of $He^+$ ions and also the annealing temperatures at operation 505 may be varied in order to enhance vacancy mobility and reduce parasitic paramagnetic species.

In some embodiments, the ion beam may be oriented at a sufficiently steep angle, as measured from an axis perpendicular to the crystal surface, so as to implant ions along substantially the full height of the crystal nanostructures. For example, FIG. 5 illustrates a dotted line axis perpendicular to the crystal surface, and an arrow representing an ion beam at an angle θ relative to the axis. In some embodiments, the angle θ may be 5 degrees or less. In some embodiments, the angle θ may be about 4 degrees.

In some embodiments, implanting ions in the surface layer at operation 504 may comprise using an ion beam of sufficient intensity and for sufficient duration to implant a large number of ions in the surface layer. For example, one billion or more ions may be implanted in the doped nanostructured crystal. In some embodiments, multiple billions of ions may be implanted. Operation 504 may be followed by operation 505.

At the "Anneal" operation 505, the doped nanostructured crystal may be annealed, e.g., in an annealing oven, at a desired temperature for a desired period of time. In some embodiments, the doped nanostructured crystal may be annealed at a temperature of 800-1100° C. for a period of one hour or more.

At the "Assemble Spectrometer" operation 506, the components of the magnetic resonance spectrometer, e.g., as illustrated in FIG. 1, may be assembled. The assembled components may include the doped nanostructured crystal fabricated via operations 501-505, which may optionally be placed in a microfluidic chip as shown in FIG. 4.

Figure 6:
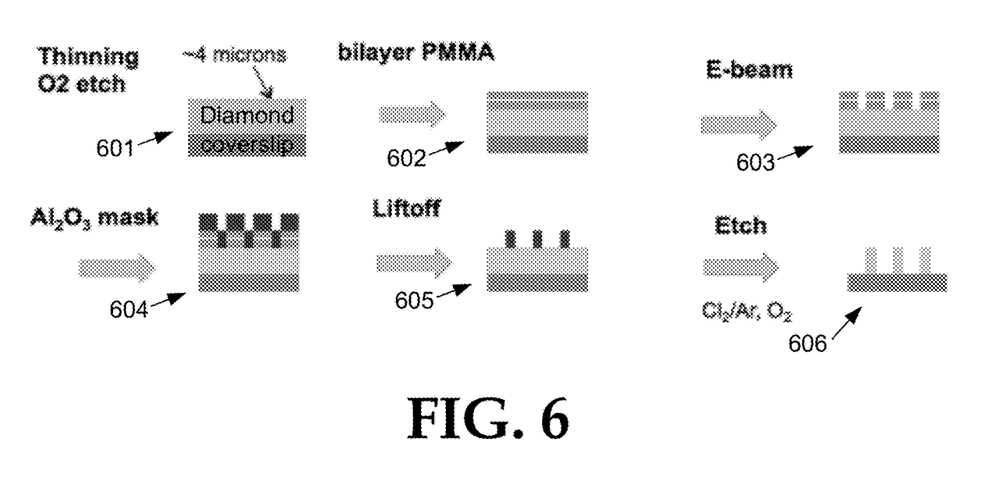
FIG. 6 illustrates an example electron beam lithography process for fabricating high aspect ratio, dense crystal nanostructures.

FIG. 6 illustrates an example electron beam lithography process for fabricating high aspect ratio, dense crystal nanostructures. A diamond membrane may be polished down to about 530 microns, then mounted on a quartz substrate and thinned further using Oxygen (02) plasma etching, resulting in the intermediate state diamond 601. A bilayer electron beam resist mask may then be deposited on diamond 601, resulting in the intermediate state diamond 602. Diamond 602 may be exposed to the desired pattern using electron beam lithography, resulting in the intermediate state diamond 603. A mask, typically comprised of $Al_2O_3$ and an adhesion metal, is deposited, resulting in the intermediate state diamond 604. After liftoff, $Al_2O_3$ mask nanostructures remain, resulting in the intermediate state diamond 605. A combination of $Cl_2$, Ar, and $O_2$ plasma etching may then be used to form the nanostructures, resulting in the diamond 606. In some embodiments, the etch directivity may be tailored to prevent nanostructure sidewalls from merging, allowing for aspect ratios of, e.g., >15. In some embodiments, hard masks, including predefined slots in Si, may be placed on top of diamond to enhance the etch selectivity further. Such methods may allow for feature aspect ratios >40 in some embodiments.

In some embodiments, fabrication processes may impart hydrophilic surface terminations at the doped nanostructured crystal. Hydrophilic surface terminations may allow for wetting of the nanostructures without compromising magnetic resonance spectrometer performance. In some embodiments, the doped nanostructured crystal may be annealed in oxygen to remove $sp^2$ carbon and hydrogen terminations and leave the surface oxygen terminated, which keeps NVs in the desired charge state. In some embodiments, protective films such as metals may be deposited on the doped crystal nanostructures to shield light from the analyte 104, thereby protecting analyte 104 from photodamage without compromising too much on sensor-sample distance.

Figure 7:
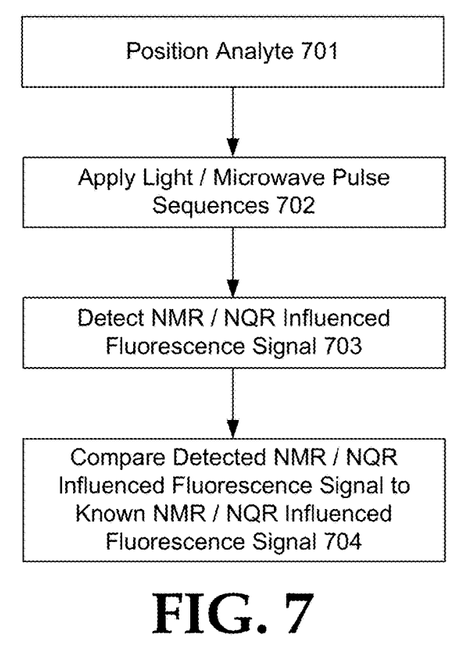
FIG. 7 illustrates an example method to identify a chemical composition of an analyte from Nuclear Magnetic Resonance (NMR) or Nuclear Quadrupole Resonance (NQR) of the analyte.
Figure 8:
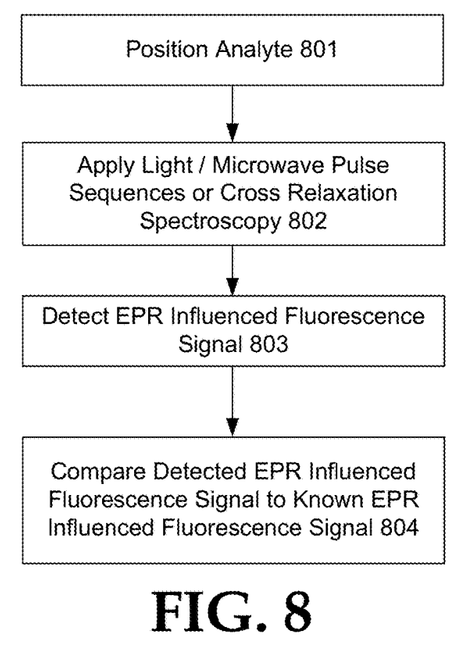
FIG. 8 illustrates an example method to identify a chemical composition of an analyte from Electron Paramagnetic Resonance (EPR) of the analyte.

FIG. 7 illustrates an example method to identify a chemical composition of an analyte from NMR or NQR of the analyte, in accordance with some embodiments of this disclosure. FIG. 8 illustrates an example method to identify a chemical composition of an analyte from EPR of the analyte, in accordance with some embodiments of this disclosure. FIG. 7 and FIG. 8 include similar operations and so will be discussed together.

The example methods of FIG. 7 and FIG. 8 include, "Position Analyte" 701/801, "Apply Light/Microwave Pulse Sequences" 702/802, "Detect NMR/NQR Influenced Fluorescence Signal" 703 (FIG. 7) and "Detect EPR Influenced Fluorescence Signal" 803 (FIG. 8), and "Compare Detected NMR/NQR Influenced Fluorescence Signal to Known NMR/NQR Influenced Fluorescence Signal" 704 (FIG. 7) and "Compare Detected EPR Influenced Fluorescence Signal to Known EPR Influenced Fluorescence Signal" 804 (FIG. 8).

At the "Position Analyte" operations 701/801, the analyte 104 may be positioned between a plurality of doped crystal nanostructures 102 of a doped nanostructured crystal 101. The doped crystal nanostructures 102 may have any of the various propertied described herein, e.g., the doped crystal nanostructures 102 may have at least one dimension of ten microns or less, and may comprise diamond in some embodiments. The plurality of doped crystal nanostructures may be doped with paramagnetic color centers, such as NV color centers as described herein.

In some embodiments, positioning the analyte 104 between the plurality of doped crystal nanostructures may comprise delivering the analyte 104 through a microfluidic chip 401 to the plurality of doped crystal nanostructures, e.g., as illustrated at FIG. 4. In other embodiments, other approaches may be used, such as directly depositing analyte on the doped nanostructured crystal 101.

It will be appreciated that different techniques may be used to position different analytes under a variety of different possible conditions. Analyte 104 may comprise a powder, a liquid, a gel, a frozen material, or otherwise in some embodiments. Furthermore, different quantities of analyte may be available. In some embodiments, techniques described herein may be applied to measure analyte volumes of one micro liter or less, although larger analyte volumes may also be used when available. Also, measurements may be made under a variety of different temperature conditions. In some embodiments, techniques described herein may advantageously be performed at ambient room temperature, across a wide range of ambient temperatures typical of Earth's climate. While the techniques described herein can advantageously be applied to different analytes, at different quantities and temperatures, such variables may affect the desired approach to positioning the analyte in the doped nanostructured crystal 101, as will be appreciated. Operations 701/801 may be followed by operations 702/802.

At the "Apply Light/Microwave Pulse Sequences" operation 702 and the "Apply Light/Microwave Pulse Sequences or Cross Relaxation Spectroscopy" operation 802, one or more laser beam pulses 124 and/or one or more microwave pulses may be directed at the doped nanostructured crystal 101 in order to interrogate the paramagnetic color centers therein. Different pulse sequences may be appropriate for different measurements. For example, methods according to FIG. 7 which measure NMR of the analyte 104 may apply one or more first pulse sequence types, methods according to FIG. 7 which measure NQR of the analyte 104 may apply one or more second pulse sequence types, and methods according to FIG. 8 which measure EPR of the analyte 104 may apply one or more third pulse sequence types. This disclosure is not limited to any specific pulse sequences, and any pulse sequence, whether known or yet to be discovered, may be applied in methods according to this disclosure.

In some embodiments of operation 802, cross-relaxation spectroscopy may be employed as an alternative method to stimulate an EPR response in the analyte 104. In an example cross-relaxation spectroscopy process, one or more light pulses may be directed at the doped nanostructured crystal 101 while modifying (sweeping) the magnetic field produced by magnets 111 at the doped nanostructured crystal 101 and monitoring changes in fluorescence 125. Embodiments employing cross-relaxation spectroscopy need not use microwave or radio frequency fields during measurement. Therefore, in some embodiments, magnetic resonance spectrometer 100 need not include microwave resonator 112.

Different pulse sequence types may generally vary in number of pulses, pulse durations, spacing between pulses, pulse frequency, pulse amplitude, and pulse phase. Light pulses may generally have any wavelengths between 500-650 nm, as described herein.

In some embodiments, operations 702/802 may be performed by programming measurement control electronics 110 to perform desired pulse sequences, by electronically activating laser 123 and microwave resonator 112 at desired pulse intervals.

In some embodiments, operations 702/802 may accompanied by application of a magnetic field, e.g., a magnetic field produced by magnets 111. For example, magnets 111 may be arranged to generate a magnetic field of 1-100 mT at the doped nanostructured crystal. When magnets 111 are permanent magnets, no action may be needed to apply the magnetic field. In some embodiments, e.g., where magnets 111 are electromagnets, an operation to apply a magnetic field may also be performed. Operations 702/802 may be followed by operations 703/803. In some embodiments, operations 702/802 and operations 703/803 may be performed substantially concurrently as pulses are generated and corresponding fluorescence signals are emitted.

At the "Detect NMR/NQR Influenced Fluorescence Signal" operation 703 (FIG. 7) and "Detect EPR Influenced Fluorescence Signal" operation 803 (FIG. 8), a NMR or NQR (FIG. 7) influenced fluorescence signal emitted from the doped nanostructured crystal, or an EPR influenced fluorescence signal emitted from the doped nanostructured crystal (FIG. 8) may be detected, e.g., using photodetector 126. In some embodiments, detected fluorescence signals 125 may be recorded in a memory at computer 130. The detected NMR, NQR, or EPR influenced fluorescence signal is influenced by the chemical composition of the analyte 104, and therefore can be used to identify properties of the analyte 104. The detected NMR, NQR, or EPR influenced fluorescence signal may generally comprise a wavelength between 650 nm and 800 nm. Operations 703/803 may be followed by operations 704/804.

At the "Compare Detected NMR/NQR Influenced Fluorescence Signal to Known NMR/NQR Influenced Fluorescence Signal" operation 704 (FIG. 7) and "Compare Detected EPR Influenced Fluorescence Signal to Known EPR Influenced Fluorescence Signal" operation 804 (FIG. 8), the NMR, NQR, or EPR influenced fluorescence signal detected at operations 703/803 may be compared to at least one known NMR, NQR, or EPR influenced fluorescence signal, in order to identify the chemical composition of the analyte 104. For example, computer 130 may be equipped with a library of known NMR, NQR, or EPR influenced fluorescence signals. Computer 130 may compare the NMR, NQR, or EPR influenced fluorescence signals detected at operations 703/803 with each of the NMR, NQR, or EPR influenced fluorescence signals in the library, to ascertain whether one or more matching known NMR, NQR, or EPR influenced fluorescence signals are present. Matching known NMR, NQR, or EPR influenced fluorescence signals may be associated with chemical composition properties, which can be attributed to analyte 104. The phrase "identify the chemical composition of the analyte" as used herein refers to identifying any aspect of the chemical composition of the analyte, which is not necessarily the entire composition.

In some embodiments, methods according to FIG. 7 and FIG. 8 may offer reproducible measurements of chemical specificity over a broad range of liquid and powder analytes, while requiring <1 µL of analyte and being competitive on portability and cost. Specifically, methods may improve upon existing analytical methods with the following capabilities: 1. Sensitivity to nanogram trace quantities for sample limited analyses involving scarce or expensive reagents such as metabolite analysis and criminal forensics. 2. Detection of the NQR fingerprints of trace residues of explosives, narcotics, and biohazardous materials. There is a notable absence in the market of a dedicated NQR spectrometer for security. 3. Analysis of samples requiring observation of unusual nuclei and extended temperature range, including polymers, inorganic compounds and petroleum industry samples.

In some embodiments, methods according to FIG. 7 and FIG. 8 may offer the rich chemical specificity of NQR in a magnetic resonance spectrometer that operates at ambient temperature (or up to 700 degrees Kelvin (K)), and may measure nanogram quantities of analyte in a range of magnetic fields easily generated by small permanent magnets (e.g., ~1 mT). Such methods may be used in connection with enhanced security and screening of explosives, narcotics, and biohazardous materials.

In some embodiments, methods according to FIG. 7 and FIG. 8 may furthermore offer chemical sensing by performing NQR spectroscopy at low magnetic fields (e.g., below ~10 mT). NQR spectra arise due to the interaction of certain nuclear spins (with spin>½) with their ambient electric field gradient. The most abundant NQR active spin is $^{14}$N which fortunately is commonly found in important analytes such as explosives, narcotics, and biohazardous materials. Although many molecules contain $^{14}$N, NQR spectra vary greatly between different molecules, as the electric field gradient depends sensitively on the electronic composition of the host molecule. This allows the use of methods according to FIG. 7 and FIG. 8 to distinguish different molecular species. Furthermore, methods may rely on statistical polarization, rather than thermal polarization, and thus are able to operate at room temperature without affecting the signal strength. In some embodiments, a magnetometer may be used to directly measure the nuclear magnetization, thereby avoiding the poor sensitivity that is commonly experienced in frequency dependent flux detection.

NMR and NQR detection rely on detection of nuclear magnetization. In the presence of an external magnetic field (for NMR) or internal electric field gradient (for NQR), nuclear spin levels split and the nuclear magnetization undergoes spin precession at a frequency proportional to the spin level energy splitting. For NQR, this frequency is typically in the 0-5 MHz range. The precessing nuclear magnetization produces an oscillating magnetic field, which may be detected by the magnetic resonance spectrometer 100.

Statistical polarization dominates for NMR/NQR detection in nanostructures at practical magnetic fields and temperatures. Therefore, in magnetic resonance spectrometer 100 may detect statistical polarization to form NMR/NQR spectra. For NQR, this boosts sensitivity, while conversely, using larger magnets will not improve signal strength. One feature of statistical polarization is that it is independent of temperature. Thus when used for NQR measurements, the magnetic resonance spectrometer 100 may have a flat response over a broad range of temperatures.

Statistical polarization may constantly change in magnitude and direction, owing to the finite correlation time of the interacting nuclear spins. In order to detect statistical polarization, embodiments may apply pulse protocols which directly detect the rms of the magnetic field. The pulse protocols are illustrated in FIG. 9.

Figure 9:
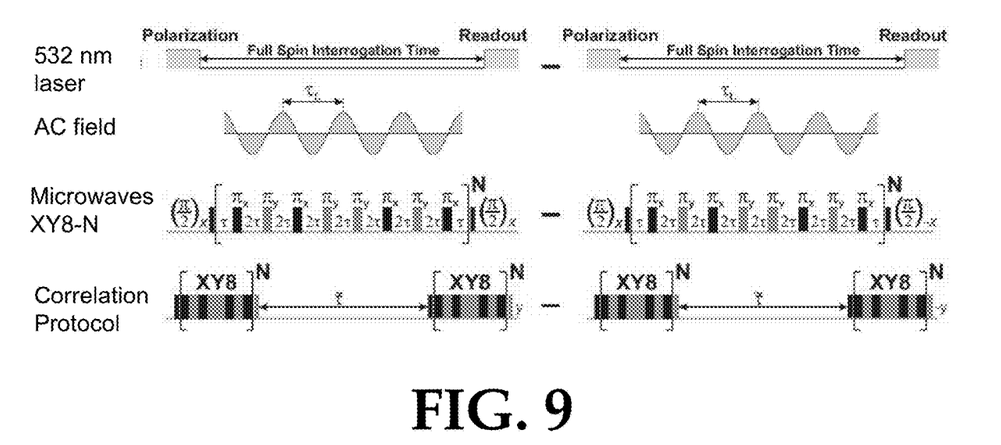
FIG. 9 illustrates example pulse protocols which may be used to perform a measurement using the disclosed magnetic resonance spectrometer.

FIG. 9 illustrates example pulse protocols which may be used to perform a measurement using the disclosed magnetic resonance spectrometer. A laser pulse (532 nm wavelength) polarizes NV centers into the $m_s=0$ spin level via a spin dependent intersystem crossing. Microwaves resonant with the NV centers' $m_s=0 \rightarrow m_s=1$ electron spin levels rotate the NV spins into the transverse plane via a $\pi/2$ pulse. Then a series of $\pi$ pulses are applied to flip the NV spin back and forth at a rate equivalent to the desired detection frequency. $\pi_x$ pulses and $\pi_y$ pulses are shifted relative to each other by 90°. The effect of these pulses is to allow for the NV center to accumulate a small amount of phase related to the root mean squared (rms) of the Alternating Current (AC) magnetic field produced by nuclear magnetization. A final $\pi/2$ pulse projects accumulated phase onto the $m_s$ basis and the readout of the NV spin state is performed with a final green laser pulse owing to spin dependent fluorescence.

With reference to FIG. 9, optical pulses may be used to pump and probe NV spin state via spin dependent fluorescence. Microwave multi pulse sequences may be applied between optical pump and probe pulses. $\pi_x$ pulses and $\pi_y$ pulses are shifted relative to each other by 90°. A change in the NV response is observed when separation between $\pi$ pulses $2\tau$ is equal to half period of the nuclear precession $\tau_L$. In order to reject common noise the pulse sequences may be repeated with the phase of the last $\pi/2$ pulse shifted by 180° (from x to −x for XY8-N and from y to −y for correlation protocol). The resulting signals may then be subtracted and normalized to give the measurement results.

Pulse protocols may be optimized for different applications. For applications requiring high sensitivity, but only modest spectral resolution, XY8-N pulse sequences may be used. For applications requiring high spectral resolution, the correlation protocol may be applied. FIG. 9 illustrates both pulse protocols. In some embodiments, an alternative approach may eliminate the need for RF or microwave fields by performing cross-relaxation spectroscopy (CRS).

Figure 10:
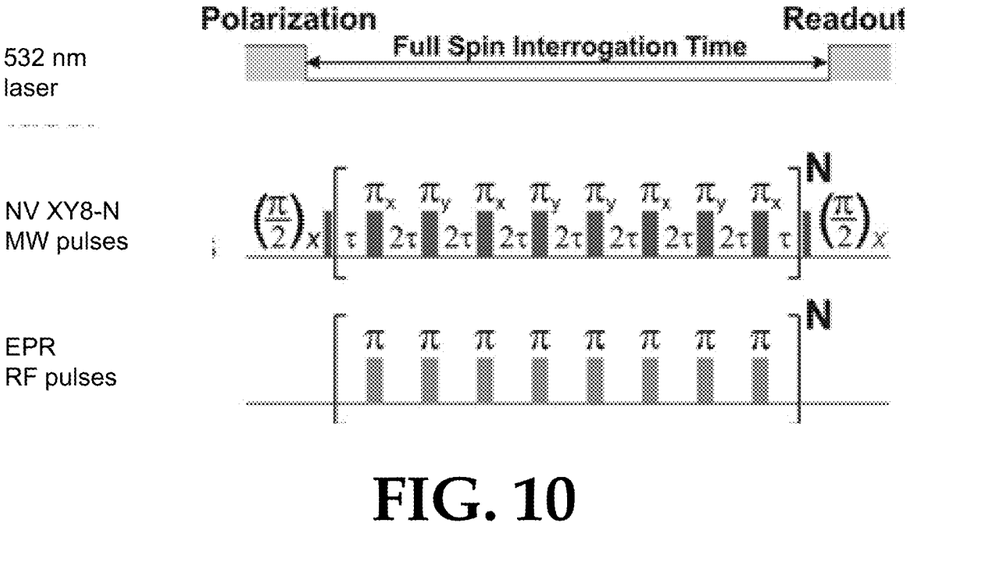
FIG. 10 illustrates example pulse protocols which may be used to perform an EPR measurement using the disclosed magnetic resonance spectrometer.

In some embodiments, the disclosed magnetic resonance spectrometer 100 may be used as a nanophotonic EPR sensor, e.g., by performing the method of FIG. 8. FIG. 10 illustrates example pulse protocols which may be used to perform EPR measurements using the disclosed magnetic resonance spectrometer 100.

For EPR, analysis of the detected time-dependent fluorescence signal 125 reveals the EPR spectrum of the analyte 104, which can be identified based on established libraries. This process is analogous to Double-Electron-Electron Resonance (DEER) in traditional EPR, except here, external spin species (the analyte 104) may be detected by Pulsed Optical Detection (POD) of another spin species (NV centers) inside the doped nanostructured crystal 101.

FIG. 10 illustrates and example EPR sensing protocol via POD-DEER. Common mode rejection is performed by normalizing to a nearly identical sequence with the final NV $\pi/2$ pulse along −x. In some embodiments, POD-DEER protocols may be based on diamond sensor protocols which directly detect Bstat. Optical pulses may be used to pump and probe the NV spin state via spin dependent fluorescence. Microwave and radiofrequency multi pulse sequences may be applied between optical pump and probe pulses to interrogate the NV and analyte electron spins, respectively. As in traditional DEER, a change in NV response may be observed when the RF frequency is in resonance with the analyte spins. Alternative approaches may eliminates the need for RF or microwave fields by performing cross relaxation spectroscopy (CRS).

In EPR measurement embodiments, magnetic resonance spectrometer 100 may be capable of detecting minute quantities of biological analytes. The magnetic resonance spectrometer 100 may be used to detect EPR signals from biological targets in substantially ambient conditions.

In some embodiments, the disclosed magnetic resonance spectrometer 100 may have a relatively small size (~1 mm) and microfluidic integration, which facilitates parallel, multi-channel operation. This may furthermore allow for larger-scale studies as well as delaying the need to clean the magnetic resonance spectrometer 100.

The specific detection of biomolecules plays a central role in modern life science including cell systems biology, high-throughput drug screening, and clinical oncology. In addition to fluorescence microscopy, NMR, and radiation techniques, EPR has emerged as a nearly-background-free molecular sensing modality. Proteins and other large biomolecules typically do not exhibit magnetic signatures, but if tiny molecular-sized magnets are attached to them, it is possible to use EPR to determine their structure and dynamics with exquisite contrast. Intrinsic EPR contrast is also present in some cases. For example, hemozoin crystals, a byproduct of malarial parasites, are paramagnetic and thus their EPR detection may enable early diagnosis of malaria infection.

Therefore in some embodiments, at least one known EPR influenced fluorescence signal, to which detected fluorescence 125 may be compared, may include the EPR influenced fluorescence signal produced by the malarial byproduct hemozoin, in order to identify whether the chemical composition of the analyte 104 includes hemozoin.

The use of EPR to identify the presence of hemozoin may, but need not necessarily, involve the use of magnetic resonance spectrometer 100. It is appreciated that other devices capable of measuring EPR may be employed in some circumstances. Therefore, in some embodiments of this disclosure, methods to identify hemozoin in a biological analyte need not be limited to any specific device. For example, methods may comprise positioning the biological analyte in an EPR sensor at an (optionally modified) operation 801; performing, with the EPR sensor, an EPR stimulation protocol to stimulate EPR in the biological analyte at an (optionally modified) operation 802; detecting an EPR response from the biological analyte an (optionally modified) operation 803; and comparing the EPR response from the biological analyte to a known EPR response for hemozoin, wherein the biological analyte comprises hemozoin when at least a portion of the EPR response from the biological analyte comprises the known EPR response for hemozoin, an (optionally modified) operation 804. When such methods are performed with the magnetic resonance spectrometer disclosed herein, the EPR stimulation protocol may comprises the one or more light pulses and one or more microwave pulses directed at the doped nanostructured crystal in order to interrogate the paramagnetic color centers, and the EPR response may comprise an EPR influenced fluorescence signal emitted from the doped nanostructured crystal, as will be understood with the benefit of this disclosure. Example biological analyte which may be measured for the presence of hemozoin include human fluids, such as human blood or other fluids.

In some embodiments, the magnetic resonance spectrometer 100 may be applied in the field of cell systems biology. For example, some methods according to this disclosure may apply the disclosed magnetic resonance spectrometer 100 in connection with spin labeling techniques to allow for accurate tracking of distances between selected sites in macromolecules, elucidating molecular structure and dynamics. Currently, these experiments require large sample volumes, cryogenic temperatures, and/or large magnetic fields and take many hours of acquisition. The use of nL sample volume, ambient temperature, and moderate magnetic field through the use of the disclosed magnetic resonance spectrometer 100 may reduce instrument size and cost, enabling a broader community of researchers access. In some embodiments, the magnetic resonance spectrometer 100 may be used in high-throughput screening by integrating with microfluidics and detecting the EPR signatures of spin-labeled biomolecules, such as aptamers and proteins, in nanoliter sample volumes.

Some methods according to this disclosure may apply the disclosed magnetic resonance spectrometer 100 in connection with genomic aptamers that can bind to ligands with high affinity and specificity. Genomic aptamers are currently used in drug development, molecular imaging, and targeted therapy. However, they suffer from rapid degradation and their selection is a time- and labor-consuming process. Rapid, high-throughput EPR detection using the disclosed nanophotonic EPR sensor may enable more efficient selection of aptamers while avoiding sample degradation.

While various embodiments have been disclosed herein, other aspects and embodiments will be apparent to those skilled in art.

The invention claimed is:

1. A Nuclear Magnetic Resonance (NMR) or Nuclear Quadrupole Resonance (NQR) spectrometer, comprising:
   a doped nanostructured crystal, the doped nanostructured crystal comprising a plurality of doped crystal nanostructures each having at least one dimension of ten microns or less, wherein the plurality of doped crystal nanostructures are doped with paramagnetic color centers, and wherein an analyte for measurement by the spectrometer may be positioned between the plurality of doped crystal nanostructures;
   a microwave resonator arranged to generate a pulsed microwave frequency electromagnetic field at the doped nanostructured crystal;
   a light source which generates one or more light pulses, wherein the one or more light pulses are directed at the doped nanostructured crystal; and
   a photodetector arranged to detect a fluorescence signal emitted from the doped nanostructured crystal, wherein the fluorescence signal is influenced by the analyte.

2. The spectrometer of claim 1, wherein doped nanostructured crystal comprises doped nanostructured diamond, and wherein the plurality of doped crystal nanostructures comprise a plurality of doped diamond nanostructures, and wherein the paramagnetic color centers comprise nitrogen-vacancy (NV) color centers.

3. The spectrometer of claim 1, wherein the plurality of doped crystal nanostructures comprise a plurality of doped crystal microgratings each having at least one dimension of ten microns or less.

4. The spectrometer of claim 1, wherein the one or more light pulses comprise laser beam pulses having a wavelength between 500 nanometers (nm) and 650 nm, and wherein the photodetector is arranged to detect fluorescence signals having a wavelength between 650 nm and 800 nm.

5. The spectrometer of claim 1, further comprising a dichroic mirror, wherein the one or more light pulses are directed at the dichroic mirror, wherein the dichroic mirror directs the one or more light pulses at the doped nanostructured crystal, and wherein the fluorescence signal emitted from the doped nanostructured crystal passes through the dichroic mirror to the photodetector.

6. The spectrometer of claim 1, further comprising a microscope objective, wherein the one or more light pulses pass through the microscope objective to the doped nanostructured crystal, and wherein the fluorescence signal passes through the microscope objective to the photo detector.

7. The spectrometer of claim 1, wherein the one or more light pulses are directed at a waveguide mode along a side of the doped nanostructured crystal, and wherein the photodetector is positioned to detect a fluorescence signal emitted through the waveguide mode.

8. The spectrometer of claim 1, further comprising one or more magnets arranged to generate a magnetic field at the doped nanostructured crystal.

9. The spectrometer of claim 1, further comprising a microfluidic chip arranged to position the analyte between the plurality of doped crystal nanostructures.

10. The spectrometer of claim 1, further comprising a computer arranged to compare the fluorescence signal to one or more known fluorescence signals.

11. A method of using a Nuclear Magnetic Resonance (NMR) or Nuclear Quadrupole Resonance (NQR) spectrometer to identify a chemical composition of an analyte, comprising:
    positioning the analyte between a plurality of doped crystal nanostructures of a doped nanostructured crystal in the spectrometer, wherein each of the plurality of doped crystal nanostructures have at least one dimension of ten microns or less, and wherein the plurality of doped crystal nanostructures are doped with paramagnetic color centers;
    directing one or more light pulses and one or more microwave pulses at the doped nanostructured crystal in order to interrogate the paramagnetic color centers;
    detecting a NMR or NQR influenced fluorescence signal emitted from the doped nanostructured crystal, wherein the detected NMR or NQR influenced fluorescence signal is influenced by the chemical composition of the analyte; and
    comparing the detected NMR or NQR influenced fluorescence signal to at least one known NMR or NQR influenced fluorescence signal, in order to identify the chemical composition of the analyte.

12. The method of claim 11, wherein the analyte has a liquid volume of one micro liter or less.

13. The method of claim 11, wherein the analyte comprises a powder.

14. The method of claim 11, wherein the method is performed at ambient temperature.

15. The method of claim 11, wherein the one or more light pulses comprise laser beam pulses having a wavelength between 500 nanometers (nm) and 650 nm, and wherein the detected NMR or NQR influenced fluorescence signal has a wavelength between 650 nm and 800 nm.

16. A method to manufacture a doped nanostructured crystal for a Nuclear Magnetic Resonance (NMR) or Nuclear Quadrupole Resonance (NQR) spectrometer, comprising:
fabricating, on a crystal surface, a plurality of crystal nanostructures each having at least one dimension of ten microns or less, wherein the crystal surface with the plurality of crystal nanostructures comprises a tenfold or larger surface area enhancement in comparison to the crystal surface without the plurality of crystal nanostructures; and
doping the plurality of crystal nanostructures with paramagnetic color centers, including:
implanting ions in a surface layer of the plurality of crystal nanostructures; and
subsequent to implanting the ions in the surface layer, annealing the plurality of crystal nanostructures.

17. The method of claim 16, wherein fabricating the plurality of crystal nanostructures comprises a lithography process including:
applying interferometric lithography or electron beam lithography to make a mask; and
removing exposed crystal which is not covered by the mask through ion etching.

18. The method of claim 16, wherein implanting the ions in the surface layer of the plurality of crystal nanostructures comprises orienting an ion beam at an angle of 5 degrees or less measured from an axis perpendicular to the crystal surface.

19. The method of claim 16, wherein the ions implanted in the surface layer comprise $^{15}N^+$ ions or $He^+$ ions.

20. The method of claim 16, wherein annealing is performed at a temperature of 800-1100° C. for a period of one hour or more.

* * * * *